(12) United States Patent
Kuwano

(10) Patent No.: US 6,571,311 B2
(45) Date of Patent: May 27, 2003

(54) PROGRAMMABLE NONVOLATILE MEMORY APPARATUS AND MICROCOMPUTER USING THE SAME

(75) Inventor: Toshikazu Kuwano, Neyagawa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/242,961

(22) PCT Filed: Jul. 2, 1998

(86) PCT No.: PCT/JP98/02977
§ 371 (c)(1),
(2), (4) Date: May 17, 1999

(87) PCT Pub. No.: WO99/01824
PCT Pub. Date: Jan. 14, 1999

(65) Prior Publication Data
US 2002/0103958 A1 Aug. 1, 2002

(30) Foreign Application Priority Data
Jul. 3, 1997 (JP) .............................................. 9-178617

(51) Int. Cl.⁷ .............................................. G06F 12/00
(52) U.S. Cl. ......................... 711/103; 711/154; 711/167
(58) Field of Search ................................. 711/103, 102, 711/151, 154, 167

(56) References Cited

U.S. PATENT DOCUMENTS

| | | | | |
|---|---|---|---|---|
| 5,687,345 A | * | 11/1997 | Matsubara et al. | 711/103 |
| 5,742,935 A | * | 4/1998 | Hazen et al. | 711/152 |
| 5,812,814 A | * | 9/1998 | Sukegawa | 711/103 |
| 5,950,222 A | * | 9/1999 | Yamada et al. | 711/103 |
| 5,991,849 A | * | 11/1999 | Yamada et al. | 711/103 |
| 6,047,352 A | * | 4/2000 | Lakhani et al. | 711/5 |
| 6,131,140 A | * | 10/2000 | Rodgers et al. | 711/104 |
| 6,148,362 A | * | 11/2000 | Sagi | 711/102 |

FOREIGN PATENT DOCUMENTS

| | | |
|---|---|---|
| JP | A-2-177091 | 7/1990 |
| JP | 05-266219 | 10/1993 |
| JP | 05-266220 | 10/1993 |
| JP | A-5-282470 | 10/1993 |
| JP | 06-060200 | 3/1994 |

* cited by examiner

Primary Examiner—Do Hyun Yoo
Assistant Examiner—Christian P. Chace
(74) Attorney, Agent, or Firm—Oliff & Berridge

(57) ABSTRACT

A programmable nonvolatile memory apparatus having a simplified circuit structure that eliminates a built-in sequencer circuit using a register (102) as a source of generating control signals required for writing data in and erasing data from an EEPROM (101). The register (102) is provided from outside a microcomputer (10) with a register address value inputted through an address bus (103), and a data value inputted through a register bus (104), and also register control signals, such as, a register write signal (105), a register read signal (106) and a register reset signal (107). The register (102) includes flip-flops. From the flip-flops, address data and rewriting data are outputted through buses (115, 116), and in addition, PRPM control signals (108 to 111, 117 and 118) are also outputted. The address space of the register (102) and the address space of the EEPROM (101) are separated from each other.

21 Claims, 11 Drawing Sheets

PROGRAMMABLE NONVOLATILE MEMORY APPARATUS AND MICROCOMPUTER USING THE SAME

FIELD OF TECHNOLOGY

The present invention relates to nonvolatile memory apparatuses such as EEPROM (Electrically Erasable Programmable Read Only Memory) and the like and microcomputers using the same.

BACKGROUND OF TECHNOLOGY

FIG. 9 shows an example of an internal structure of a semiconductor apparatus having therein an EEPROM in accordance with the conventional technology. The semiconductor apparatus has an EEPROM block 214 and a sequencer circuit 202. The EEPROM block 214 includes an EEPROM 201, a sense amplifier circuit 212 and a step-up circuit 213. The EEPROM block 214 is controlled by signals provided externally of the semiconductor apparatus, such as, a signal on an EEPROM address bus 203 to designate address values of the EEPROM 201, a data signal inputted in or outputted from the EEPROM 201 through an EEPROM data bus 204, an enable signal 205 to determine whether or not the EEPROM block 214 itself is accessed, a program signal 206 to command writing data in the EEPROM 201, and an erase signal 207 to command erasing data from the EEPROM 201.

Here, the enable signal 205, the program signal 206 and the erase signal 207 are assumed to be in active state at their respective LOW level Also, the EEPROM block 214 in the semiconductor apparatus is controlled by signals, such as an X-decoder enable signal 208, a Y-decoder enable signal 209, a sense amplifier enable signal 210, a step-up circuit enable signal 211, a program pulse signal 215 and an erase pulse signal 216, which are in active state at their HIGH level.

Here, let us consider a case where data is written in a specified address of the EEPROM 210. The data writing operation is described hereunder with reference to a timing chart at the time of writing shown in FIG. 10.

Each signal is in the following initial state. The enable signal 205, the program signal 206 and the erase signal 207 are at HIGH level, respectively. The X-decoder enable signal 208, the Y-decoder enable signal 209, the sense amplifier enable signal 210 and the step-up circuit enable signal 211 are at LOW level, respectively. A signal at a predetermined level is inputted in the address bus 203, and data of a predetermined value from the EEPROM 201 is inputted in the data bus 204.

When data is written after the initial state, first, the enable signal 205 is changed to LOW level, and an address value where data is written is inputted in the address bus 203 Then, the program signal 206 is changed to LOW level, and the data to be written is inputted in the data bus 204. At this moment, the sequencer circuit 209, that receives the enable signal 205 and the program signal 206, generates the X-decoder enable signal 208, the Y-decoder enable signal 209, the sense amplifier enable signal 210 and the step-up circuit enable signal 211 in active state, and also generates the program pulse signal 215 in active state. These signals are used to perform data writing operation by the EEPROM 201. When each of the enable signals is generated and each of the pulses has a specified pulse width according to the characteristics specification of the EEPROM 201, desired data can be written at a specified address of the EEPROM 201.

When the data writing operation is completed, each of the signals is changed to non-active state by the sequencer circuit 202, and input signals externally provided are also changed to non-active state, the initial state is reset.

Data is erased, in a similar manner as the data writing, according to FIG. 11. When data is erased, the erase signal becomes to be in active state, and the data on the EEPROM 201 is erased.

In the conventional technology described above, the sequencer circuit 202 is indispensable in the semiconductor apparatus. The signals generated by the sequencer circuit 202 must be generated at the timings shown in FIG. 10. To normally write data in the EEPROM 201, the signals must be precisely generated at signal generation timings that are close to the specification timings as much as possible. Therefore, the circuit structure of the sequencer circuit 202 becomes complex because signal delays must be precisely generated, with the result that the size of the circuit becomes larger. As a result, substantial verification and examination are required to obtain a satisfactory sequencer circuit 202, resulting in a longer development period. Also, there is a drawback that debugging is difficult in the stage of product development.

Furthermore, when the semiconductor apparatus has a structure in which all EEPROM control signals are manipulated from outside of the semiconductor apparatus, problems occur. For example, the number of terminals of the semiconductor apparatus increases, the chip integration deteriorates due to increased wiring regions, and the chip area increases. Certain measures, for example, mounting an oscillation circuit in the circuit structure, or inputting oscillation signals from outside of the semiconductor apparatus, are required to accurately obtain time delays of signals. In this case, another circuit for processing the oscillation signals has to be added to the semiconductor apparatus chip. This is not preferable when low cost products are to be supplied to the market.

Accordingly, an object of the present invention is to provide a programmable nonvolatile memory apparatus and a microcomputer using the same without mounting a built-in sequencer circuit that has a large device size and therefore takes a long time for verification, and is difficult in debugging.

Another object of the present invention is to provide a nonvolatile memory apparatus and a microcomputer using the same in which programming is possible without mounting a built-in sequencer circuit, the number of external terminals is reduced and the internal wiring area is reduced.

A still another object of the present invention is to provide a nonvolatile memory apparatus in which a register for controlling a nonvolatile memory is provided therein, but address values of the register and address values of the nonvolatile memory are prevented from overlapping with one another without having to enlarge the address area.

A further object of the present invention is to provide a microcomputer that has a reduced circuit size in which data required for programming can be inputted either in a parallel input mode or a serial input mode.

DISCLOSURE OF THE INVENTION

A nonvolatile memory apparatus in accordance with the present invention has a nonvolatile memory in which a programming mode and a normal reading mode are set; and a register connected to the nonvolatile memory. When the programming mode is set, a plurality of data necessary for execution of the programming mode is supplied to the register, and each of the data is read out from the register and supplied to the nonvolatile memory. Accordingly, a sequencer circuit is not required in the nonvolatile memory apparatus as various timing signals are also provided by the register, and therefore the circuit structure becomes simpler compared with the prior art.

Further, the programming mode may includes, in addition to the data rewriting operation, an operation of rewriting data and an operation of erasing data. When each of the operations is executed, address data, rewriting data and control data required for the operation are supplied to the register, and each of the data is read out from the register, to thereby execute programming of the nonvolatile memory.

The register may include a plurality of flip-flops. Control data is supplied to and read from the plurality of flip-flops so that a plurality of control timing signals required for execution of the programming mode are supplied to the nonvolatile memory. In this manner, the control timing signals are outputted from the flip-flops. As a result, the circuit is substantially simplified compared with the conventional sequencer circuit.

At least one of the pluralities of control timing signals has a logic in active state that is different from the others As a result, data stored in the nonvolatile memory is not destroyed even when all of the control timing signals are at HIGH or LOW when the power is turned on.

The nonvolatile memory apparatus of the present invention further includes an input/output apparatus so that data to be supplied to the register can be inputted through the input/output apparatus from outside of the apparatus.

A microcomputer in accordance with the present invention comprises a nonvolatile memory in which a programming mode and a normal reading mode are set; a register connected to the nonvolatile memory; and a central processing unit that accesses the nonvolatile memory in the normal reading mode. When the programming mode is set, data necessary for execution of the programming mode is supplied to the register, and each of the data is read out from the register and supplied to the nonvolatile memory.

The microcomputer neither requires a sequencer within the microcomputer because various timing signals are also provided from the register. As a result, the circuit structure becomes simpler compared to the prior art.

The register preferably has address values and is addressable. Also, the address values of the register preferably exist in an address space that is different from an address space to which the nonvolatile memory is allocated. As a result, the microcomputer does not require preparing address values for the register within the same address space. Accordingly, this is advantageous for a microcomputer having a particularly small address area.

The microcomputer in accordance with the present invention may further comprises an input/output apparatus, wherein a signal to be supplied to the register are inputted through the input/output apparatus from outside. As a result, the address value of the register can be designated by the signal inputted through the input/output apparatus from outside. Further, a data value to be stored in the register are also inputted from outside through the input/output apparatus. Moreover, a data value stored in the register can be initialized by a signal inputted from outside through the input/output apparatus.

The input/output apparatus may include a parallel input/output apparatus to which a plurality of data are inputted in parallel. In this case, pluralities of data inputted through the parallel input/output apparatus are supplied to the register.

The parallel input/output apparatus may comprise a first switch that is selectively connected the parallel input/output apparatus to one of a data bus connected to the central processing unit and the register. The first switch connects the parallel input/output apparatus to the register in the programming mode so that pluralities of data inputted through the parallel input/output apparatus are supplied to the register. On the other hand, the first switch connects the parallel input/output apparatus to the data bus in the normal reading mode, so that various data can be inputted or outputted through the data bus and the parallel input/output apparatus by the control of the central processing unit.

Moreover, a second switch is preferably provided to selectively connect an input/output line of the nonvolatile memory to one of a data bus connected to the central processing unit and the register. The second switch connects the input/output line of the nonvolatile memory to the register in the programming mode, so that the central processing unit can supply to the register in parallel a plurality of data serially inputted through a serial input/output apparatus. On the other hand, in the normal reading mode, the input/output line of the nonvolatile memory is connected through the second switch to the data bus. As a result, the central processing unit can use the nonvolatile memory as a storage device such as a ROM.

The input/output apparatus may include a serial input/output apparatus to which a plurality of data are inputted in serial. In this case, the central processing unit supplies the plurality of data inputted in serial through the serial input/output apparatus to the register in parallel.

The input/output apparatus may include a serial input/output apparatus to which a plurality of data are inputted in serial in the serial input mode, and a parallel input/output apparatus to which the plurality of data are inputted in parallel in the parallel input mode. In the serial input mode, the plurality of data serially inputted through the serial input/output apparatus are supplied to the register in parallel by the central processing unit. In the parallel input mode, the plurality of data inputted through the parallel input/output apparatus are supplied to the register In this case, the first and second switches may also preferably be provided.

BEST MODE FOR CARRYING OUT THE INVENTION

Figure 1:
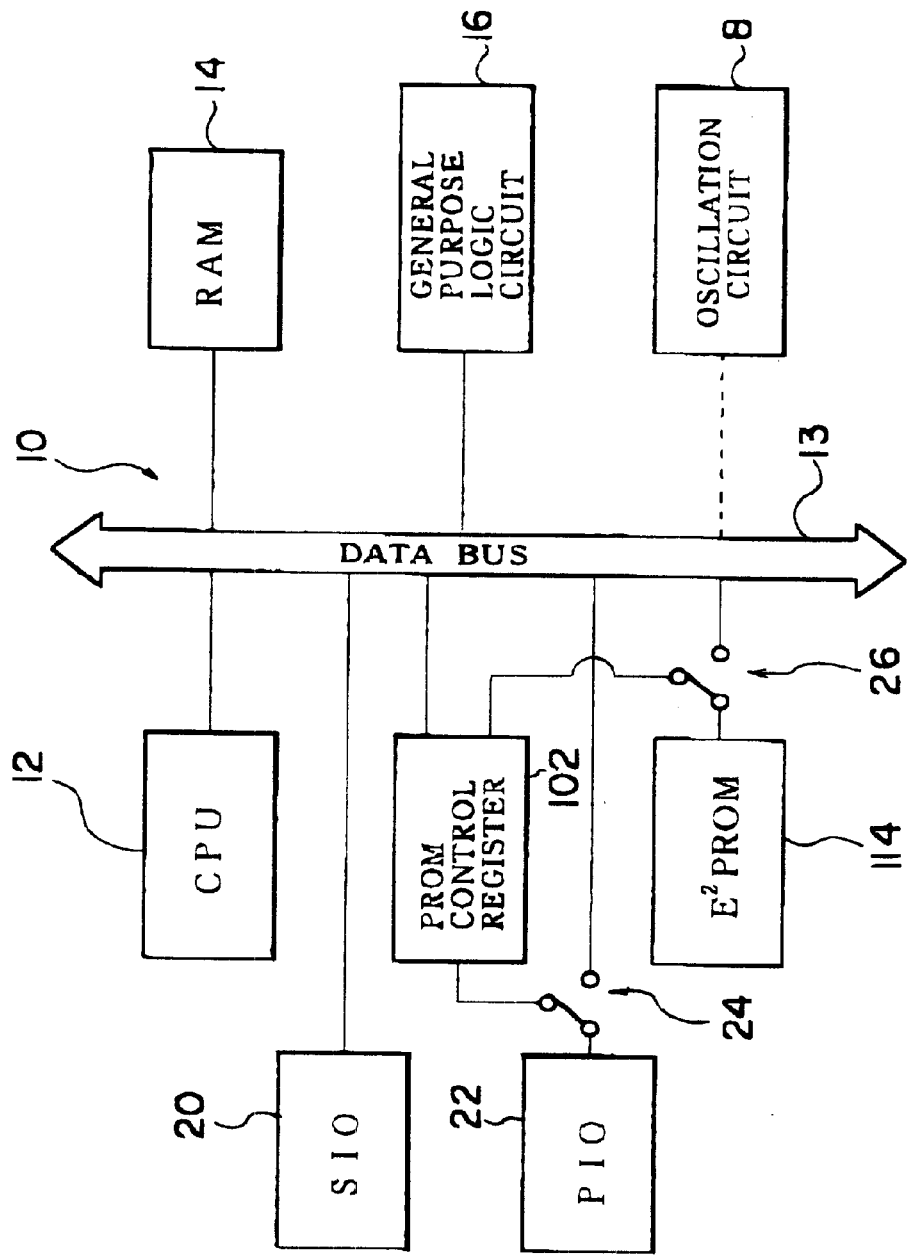
FIG. 1 is a block diagram showing a microcomputer in accordance with one embodiment of the present invention.

Embodiments of the present invention will be described in detail below with reference to the accompanying drawings.
(Outline of One-Chip Microcomputer FIG. 1 is a block diagram of a one-chip microcomputer 10 of the present invention. The microcomputer 10 shown in FIG. 1 has an EEPROM block 114 built therein, and a programming mode and a normal reading mode can be set with respect to the EEPROM block 114. Further, the programming mode of the EEPROM block 114 shown in FIG. 1 is executed in two ways. One of them is a parallel input mode, and the other is a serial input mode. The microcomputer 10 shown in FIG. 1 is capable of switching between the parallel mode and the serial mode by a signal provided externally.

The microcomputer 10 shown in FIG. 1 includes a CPU (central processing unit) 12 connected to a data bus 13, which is connected to the EEPROM block 114 and other devices, such as, a RAM (Random Access Memory) 14, a general-purpose logic circuit 16. An oscillation circuit 18 within the microcomputer 10 outputs a clock required for operation thereof.

The microcomputer 10 further includes a serial input/output apparatus 20 and a parallel input/output apparatus 22. The serial input/output apparatus 20 connects to the data bus 13. The parallel input/output apparatus 22 connects to the EEPROM block 114 and the data bus 13 through a first switch 24.

The microcomputer 10 further includes a register block 102 for controlling the EEPROM block 114. The register block 102 connects to the data bus 13. Also, the EEPROM 114 connects to the register block 102 and the data bus 13 through a second switch 26.
(Programming Mode and Normal Reading Mode)

The microcomputer 10 shown in FIG. 1 is capable of setting a programming mode to perform programming of the EEPROM block 114, and a normal reading mode to perform reading data from the EEPROM block 114 that is used as a ROM.

When the normal reading mode is set, the EEPROM 114 is connected only to the data bus 13 through the second switch 26, and its connection is cut from the register block 102. Therefore, the CUP 10 accesses the EEPROM block 114 through the data bus 13, and reads necessary data. It is noted that, in the normal reading mode, the parallel input/output apparatus 22 is connected to the data bus 13 through the first switch 24, and the connection of the parallel input/output apparatus 22 is cut from the register block 102.

Figure 2A:
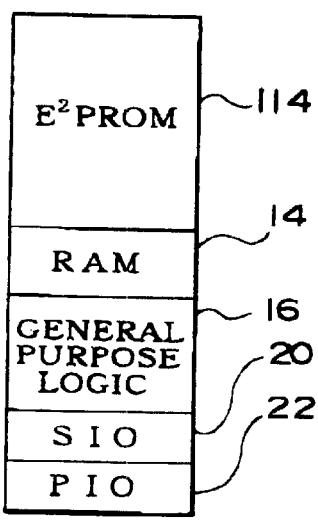
FIGS. 2A to 2C are schematical views for illustrating memory spaces in different operation modes.

In the normal reading mode, as shown in FIG. 2A, the EEPROM block 114, the RAM 14, the general-purpose block 16 and the parallel input/output apparatus 22 exist, but the register block 102 does not exist in the address space as viewed from the CPU 10.

When the programming mode is set, the EEPROM block 114 is connected to the register block 102 through the second switch 26, and its connection is cut from the data bus 13.

Also, when the programming mode is set, one of the serial input mode and the parallel input mode is selected as described below, and the programming mode is executed with respect to the EEPROM block 114 based on the selected mode.
(Parallel Input Mode and Serial Input Mode)

When the parallel input mode is selected, the parallel input/output apparatus 22 is connected to the register block 102 through the first switch 22, and is cut from the data bus 13. Therefore, the CUP 10 does not play any part in the execution of the programming mode in the parallel input mode, but only external manipulation performed outside the microcomputer 10 does. In other words, address data, memory data and control data inputted through the parallel input/output apparatus 22 are directly set in the register block 102. Based on the data set at the register block 102, signals required for programming are supplied from the register block 102 to the EEPROM block 114 to thereby perform the programming.

Figure 2B:
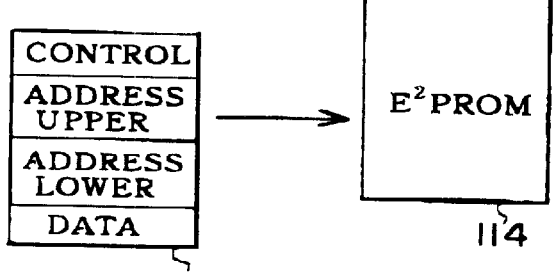

In this case, as shown in FIG. 2B, only the register block 102 exists in the memory space as viewed from outside the microcomputer 10, and the EEPROM block 114 can be recognized through the register block 102.

On the other hand, when the serial input mode is selected, the parallel input/output apparatus 22 may be kept connected to the data bus 13 through the first switch 24. In this case, address data, signal data and control data inputted through the serial input/output apparatus 20 are set at the register block 102 through the CUP 10. Based on the data set at the register block 102, signals required for programming are supplied from the register block 102 to the EEPROM block 114, to thereby perform the programming.

Figure 2C:
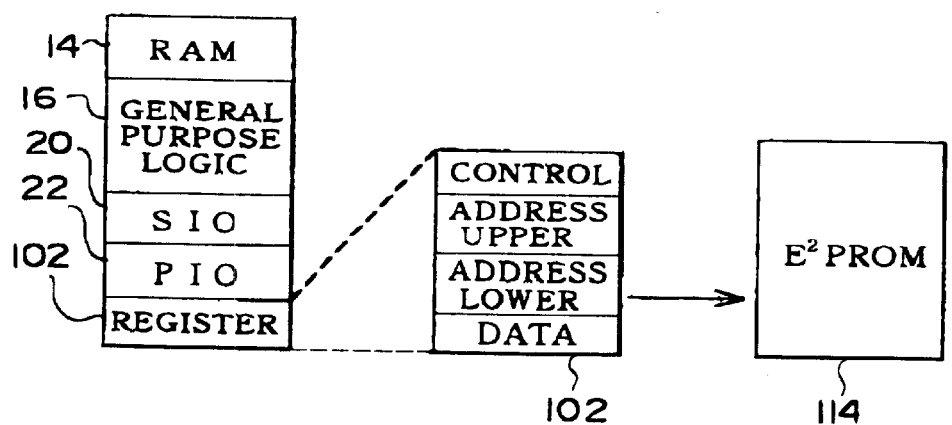

In this case, as shown in FIG. 2C, the RAM 14, the general-purpose block 16, the parallel input/output apparatus 22 and the register block 102 exist in a memory space as viewed from the CPU 10, and the EEPROM block 114 can only be recognized through the register block 102.

As apparent from FIGS. 2A to 2C, the register block 102 and the EEPROM block 114 are not necessary to exist in the same address space. In accordance with the present embodiment, they have different address spaces.

It is noted that the present invention is not limited to the present embodiment in which both of the parallel input mode and the serial input mode can be performed, but also applicable to one in which only one of the input modes is performed. When only the parallel input is accepted in the programming, the serial input/output apparatus 20 is not necessary. Also, when only the serial input is accepted in the programming, the first switch 24 is not necessary, and the parallel input/output apparatus 22 is connected to the data bus.

Also, the serial input/output apparatus 20 may be structured so that it connects to the data bus through the register block 102.
(Relation Between EEPROM Block and Register Block)

Figure 3:
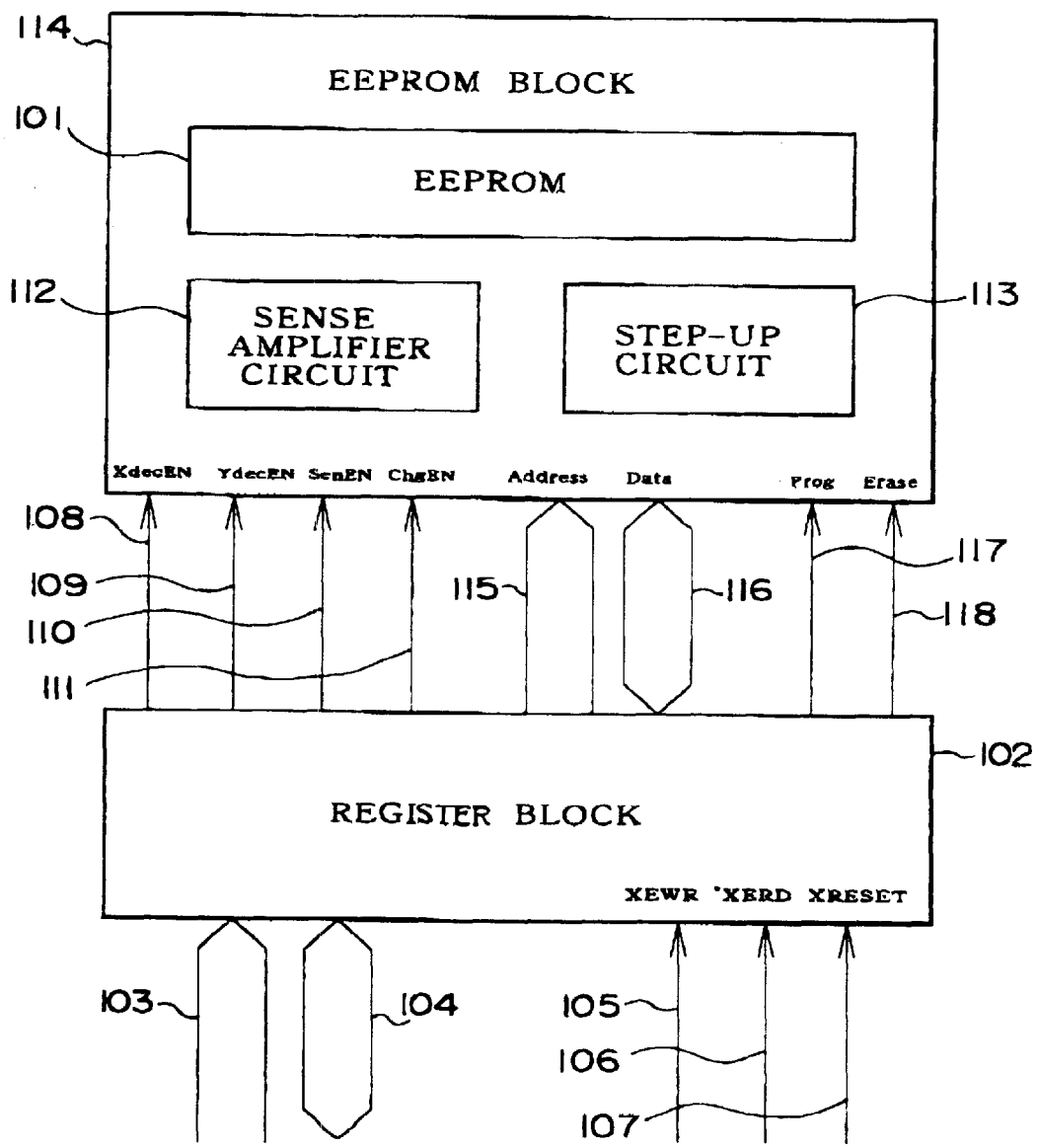
FIG. 3 is a view in detail of a register block and an EEPROM block of the microcomputer shown in FIG. 1.

FIG. 3 is an enlarged view of the EEPROM block 114 and the register block 102. The EEPROM block 114 includes an EEPROM 101, a sense amplifier 112 and a step-up voltage circuit 113. The register block 102 contains pluralities of addressed registers, which will be described in detail below.

The sense amplifier circuit 112 is a circuit that determines whether data stored in the EEPROM 101 is at HIGH level or LOW level The step-up voltage circuit 113 is a circuit that generates a voltage required for writing data in or erasing data from the EEPROM 101.

The register block 102 connects to a register address bus 103 and a register data bus 104, and is supplied with register control signals. In the parallel input mode, the register address bus 103 and the register data bus 104 are formed between the parallel input/output apparatus 22 and the register block 102. In the serial input mode, they are formed between the data bus 13 and the register block 102.

The register control signals include a register write signal 105, a register read signal 106 and a register reset signal 107. These control signals 105, 106 and 107 are assumed to be in active state at their respective LOW level. The register block 102 provides the EEPROM block 114 with EEPROM block control signals, such as, an X-decoder enable signal 108, a Y-decoder enable signal 109, a sense amplifier enable signal 110, a step-up voltage circuit enable signal 113, a programming signal 117 and an erase signal 118. Further, the register block 102 and the EEPROM block 114 are connected to one another through the EPROM address bus 115, the EEPROM data bus 116 depending upon the switching condition of the second switch.

Among the EEPROM block signals, the signals 108, 109, 110 and 113 are in active state at their HIGH level, and the signals 117 and 118 are at their LOW level.

Figure 9:
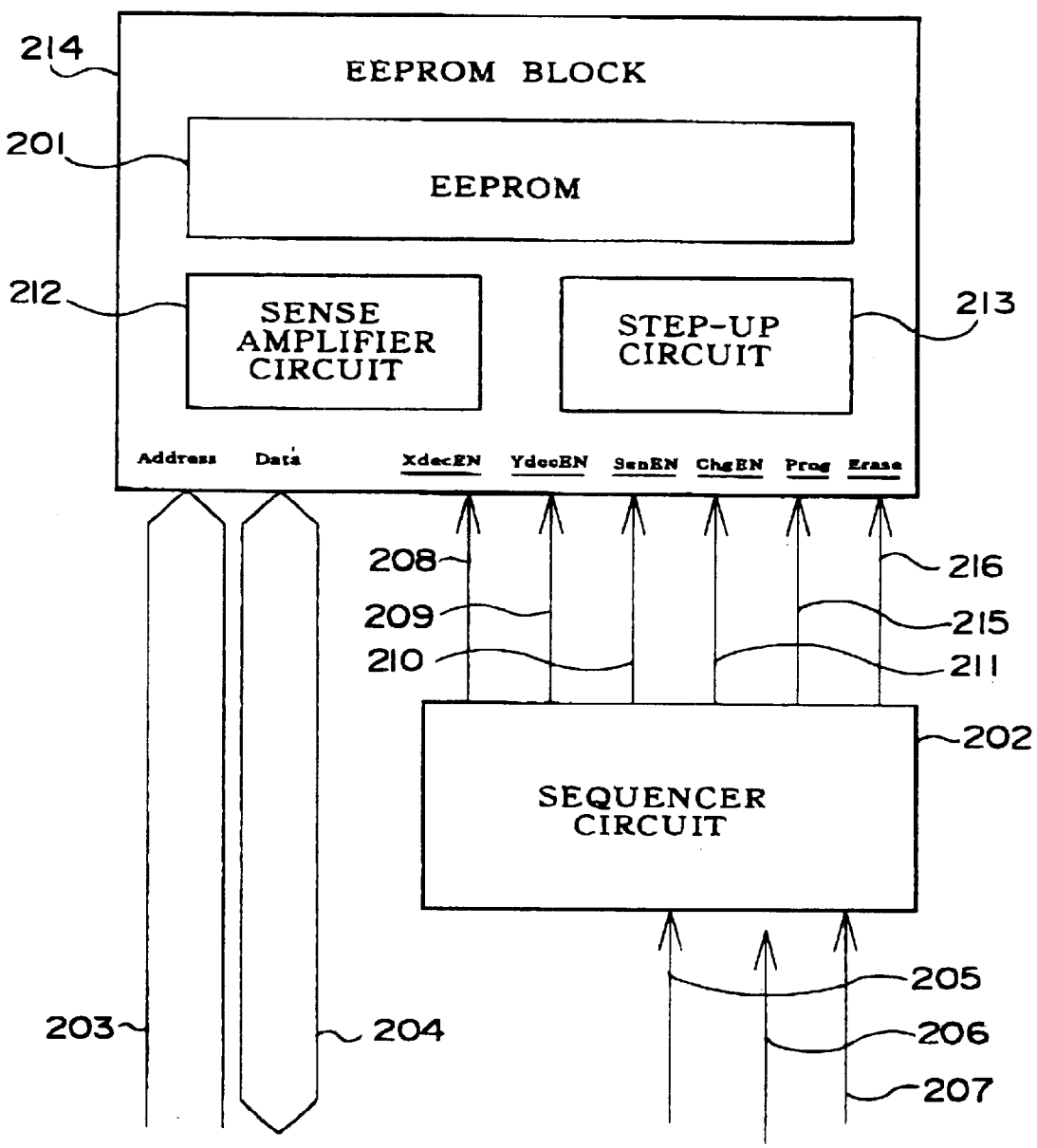
FIG. 9 is a block diagram of a structure of a conventional semiconductor apparatus.
Figure 10:
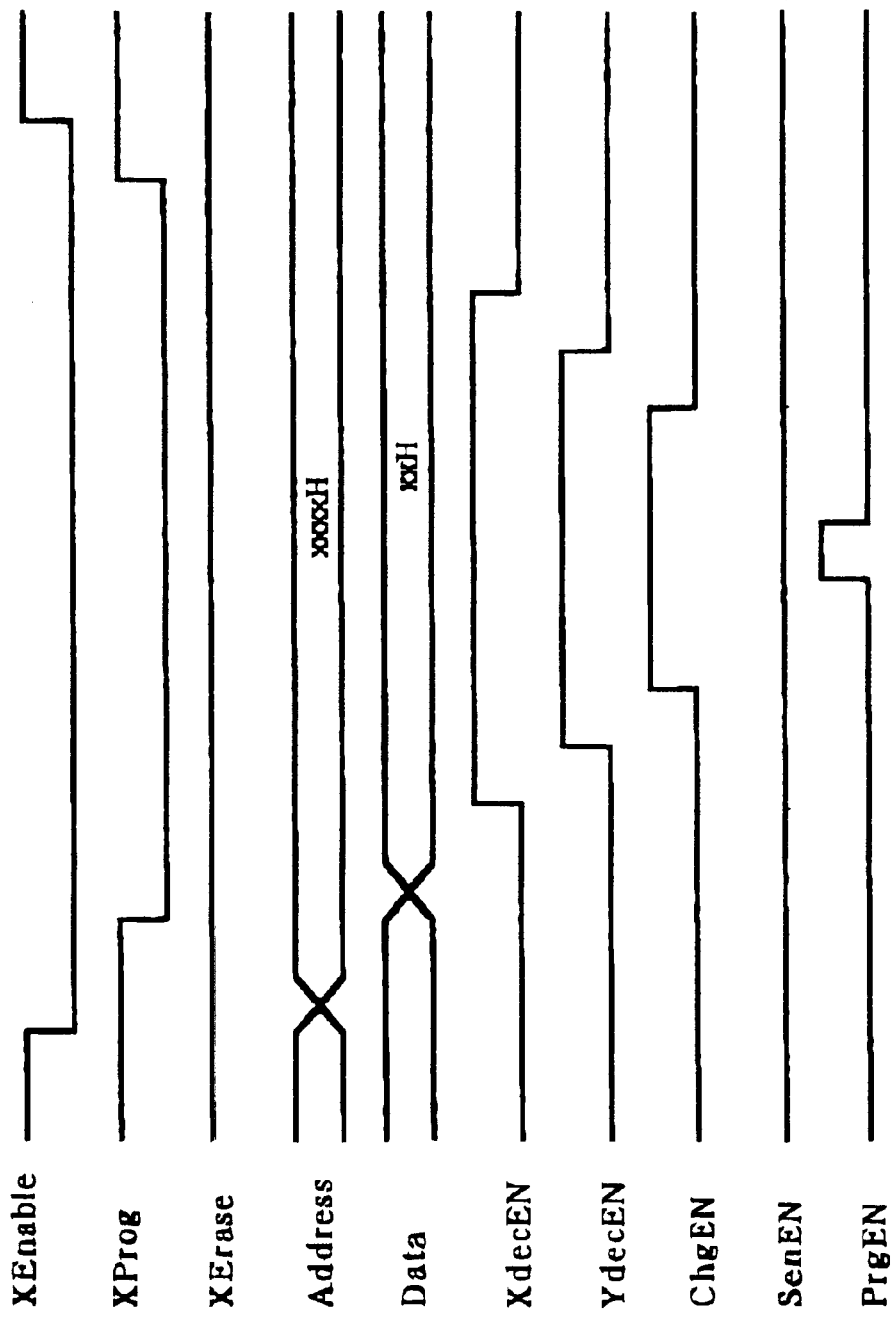
FIG. 10 is a timing chart illustrating an operation of writing data in an EEPROM in the prior art.
Figure 11:
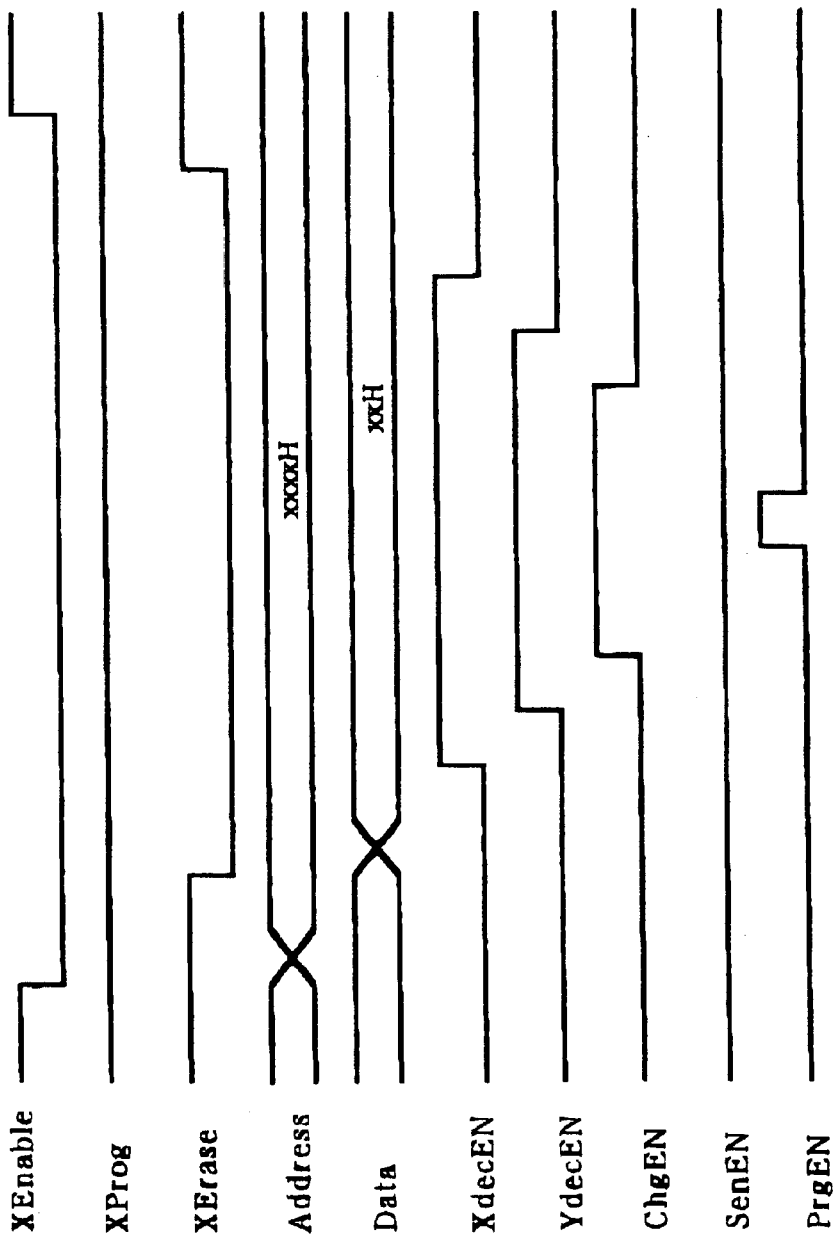
FIG. 11 is a timing chart illustrating an operation of erasing data in an EEPROM in the prior art.

Control signals required to execute the programming mode of the EEPROM 101 are generated by the register block 102 that is manipulated from outside the microcomputer 10. The EEPROM control signals are not directly manipulated from outside the microcomputer 10. The control signals to process data in the programming mode are inputted in the EEPROM 101 in a similar manner as the example of the conventional technology shown in FIG. 9.

(Description of Register Block)

Figure 4:
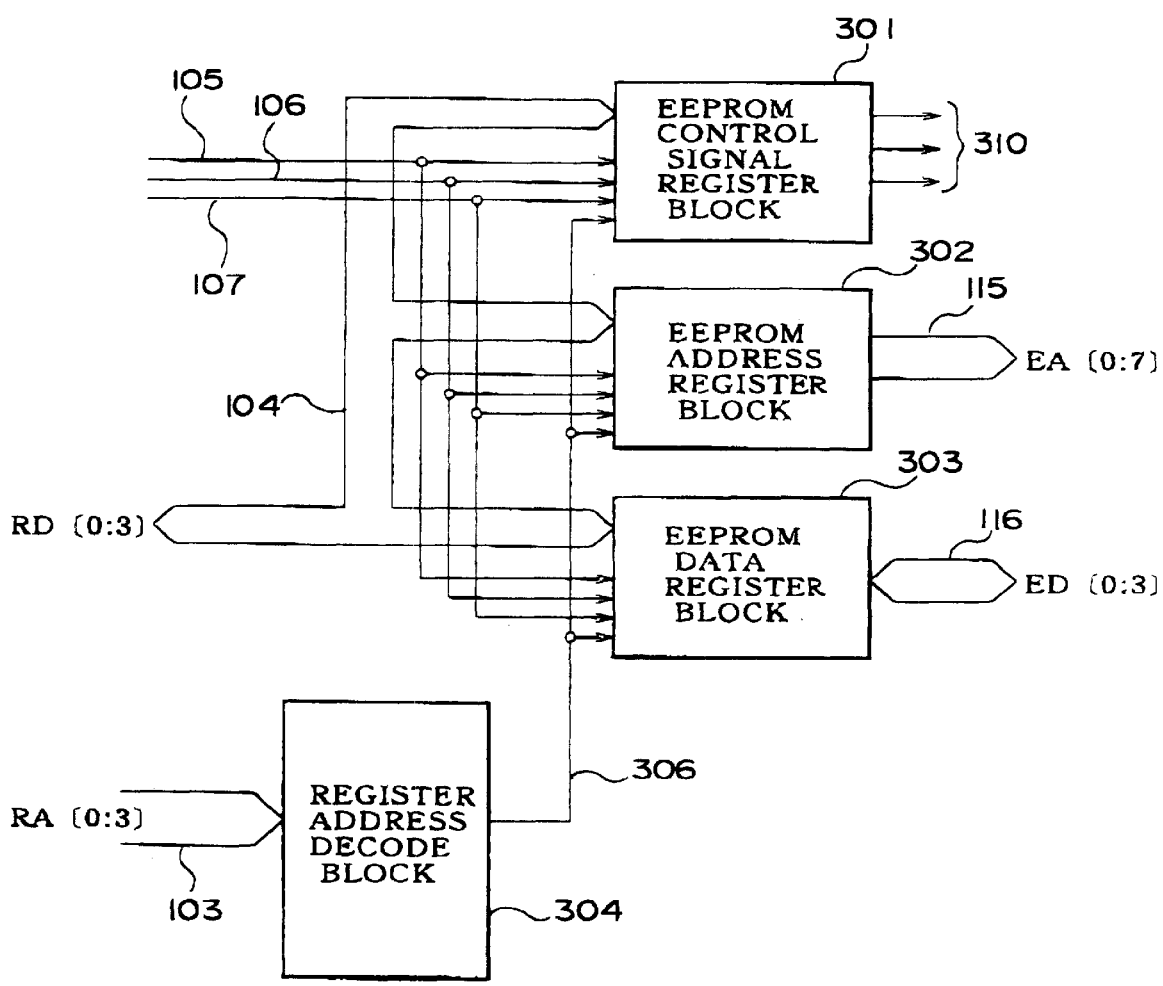
FIG. 4 is a block diagram of an internal structure of the register block shown in FIG. 3 in accordance with one embodiment.

An embodiment of the register block 102 is shown in FIG. 4. The register block 102 includes three register blocks, i.e., an EEPROM control signal register block 301, an EEPROM address register block 302 and an EEPROM data register block 303, and a register address decode block 304. The register address decode block 304 decodes contents of signals on the register address bus 103 that are inputted from outside the microcomputer 10, and provides enable signals 306 to the three register blocks 301, 302 and 303 in the next stage. One or a plurality of enable signals is inputted to each of the register blocks 301, 302 and 303. The register write signal 105, the register read signal 106 and the register reset signal 107, that are supplied from outside the microcomputer 10, are inputted in each of the three register blocks 301, 302 and 303. Also, the three register blocks 301, 302 and 303 connect to the register bus 104 for inputting and outputting data between the microcomputer 10 and external apparatuses. Different signals may be outputted from the three register blocks 301, 302 and 303 to the EEPROM block 114, or may be inputted or outputted between the register blocks and the EEPROM block 114. More particularly, the EEPROM control signals register block 301 provides a group of signals 310 that control writing/erasing of data with respect to the EEPROM (for example X-decoder enable signals shown in FIG. 3). The EEPROM address register block 302 provides address signals to the EEPROM address bus 115. The EEPROM data register block 303 outputs and inputs data signals to and from the EEPROM block 114 through the EPROM data bus 116.

In one embodiment described below, let us assume that the register address bus 103 is composed of a 3-bit signal having RA [0], RA [1] and RA [2], to designate an address, and the register bust 104 is composed of a 4-bit signal having RD [0], RD [1], RD [2] and RD [3]. An address signal on the register address bus 103 is defined below as RA [0:2], and data signal on the register bus 104 is defined as RA [0:3]. The EEPROM address bus 115 is composed of an 8-bit signal having EA[0], EA[1], EA[2], EA[3], EA[4], EA[5], EA [6] and EA [7], to designate an address. Let us also assume that the EEPROM data bus 116 is composed of a 4-bit signal having ED [0], ED [1], ED [2] and ED [3]. An address signal on the EEPROM address bus 115 is defined below as EA [0:7], and a data signal on the EEPROM data bus 116 is defined below as ED [0:3].

The address signal RA [0:2] and the data signal RD [0:3] form a pair, and the address signal EA [0:7] and the data signal ED [0:3] form another pair. These pairs are formed from similar address and data signals, but located in different spaces.

In addition, the address allocation within the register block 102 is formed as shown in Table 1 below.

TABLE 1

| RA [0:2] | Data | Use | Initial Value |
|---|---|---|---|
| 0 | RD [3] | Sense Amp. enable signal | Low |
|  | RD [3] | Step-up enable signal | Low |
|  | RD [3] | Y-decoder enable signal | Low |
|  | RD [3] | X-decoder enable signal | Low |
| 1 | RD [3] | EA [7] | — |
|  | RD [2] | EA [6] | — |
|  | RD [1] | EA [5] | — |
|  | RD [0] | EA [4] | — |
| 2 | RD [3] | EA [3] | — |
|  | RD [2] | EA [2] | — |
|  | RD [1] | EA [1] | — |
|  | RD [0] | EA [0] | — |
| 3 | RD [3] | ED [3] | — |
|  | RD [2] | ED [2] | — |
|  | RD [1] | ED [1] | — |
|  | RD [0] | ED [0] | — |
| 4 | RD [3] | Unused | — |
|  | RD [2] | Unused | — |
|  | RD [1] | Programing signal | High |
|  | RD [0] | Erase signal | High |

(Process for Executing Programming Mode)

A process for executing the programming mode of the EEPROM in the microcomputer shown in FIG. 3 will be described below.

Figure 5:
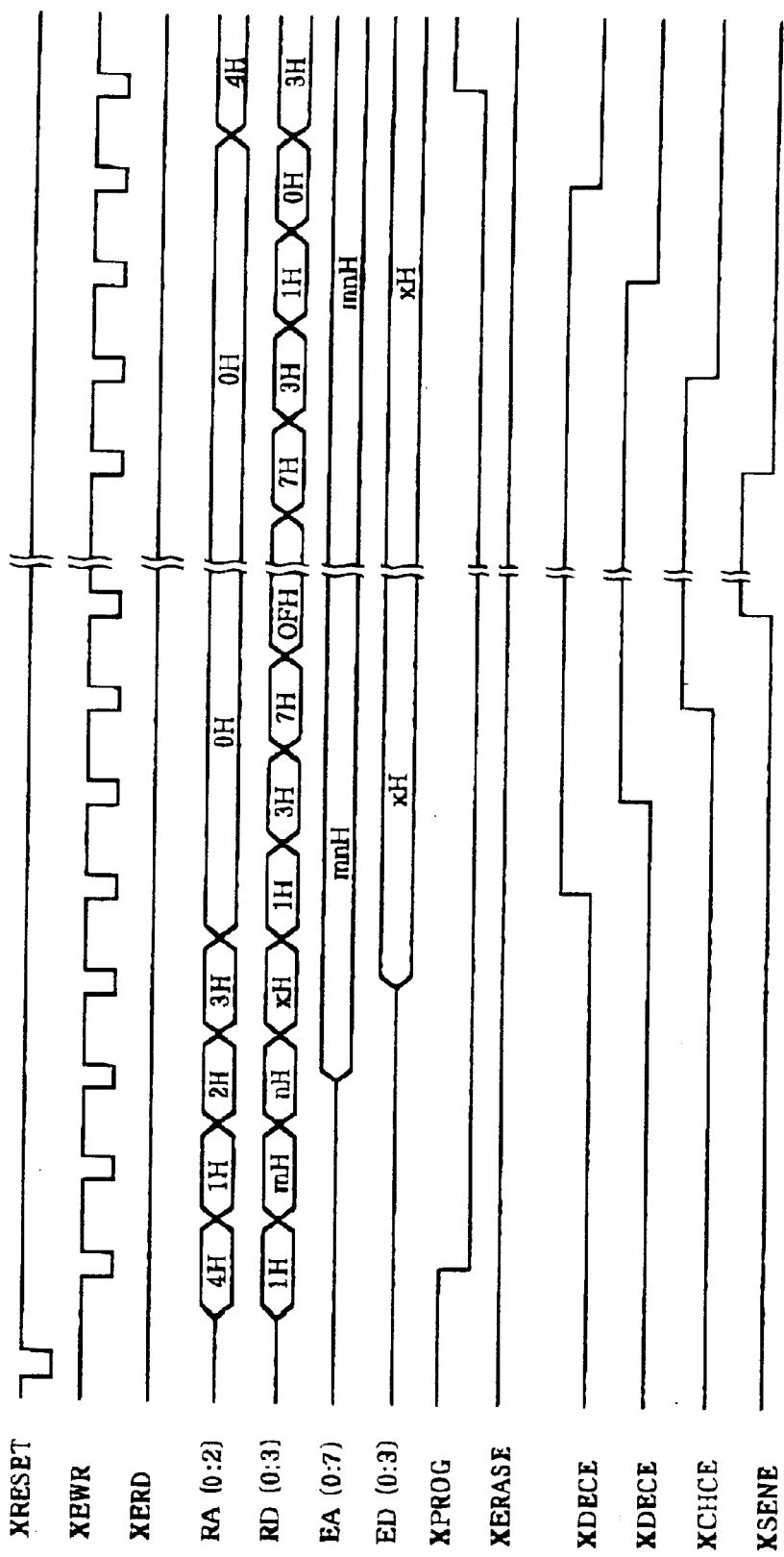
FIG. 5 is a timing chart for illustrating an operation of writing data in the EEPROM.

First, a process for data writing in one embodiment will be described with reference to the timing chart shown in FIG. 5. In the initial state, signals provided from outside the microcomputer 10, namely, a register-reset signal (XRESET), a register-write signal (XEWR) and a register-read signal (XERD) are in non-active state (HIGH level). An address signal (RA[0:2]) on the register address bus 103 and an data signal (RD [0:3]) on the register data bus 104 are at any level. Also, all of the EEPROM control signals 105, 106 and 107 provided by the register block 102 are in non-active state.

First, a LOW pulse as the register-reset signal (XRESET) is inputted to initialize the register block 102. Since the register block 102 can be initialized by an externally provided signal, the initial state for writing operation can be readily set. Then, an address of a register where data is to be written is designated by an address signal RA [0:2], and the data to be written is designated by a data signal RD [0:3]. In this instance, a LOW pulse as the register-write signal (XEWR) is inputted. As a result, the designated data is written at the designated address at a timing of the falling edge of the LOW pulse.

More specifically, after inputting a LOW pulse as the register-reset signal (XRESET), for example, data RD [0:3 ]=1H is written at the address 4 (in this instance, a signal RA [0:2]=4H, where "H" is a hexadecimal digit. Hereinafter, similarly defined.) This process is performed in the following manner. A signal "4H" is inputted in the register address bus 103 from outside the microcomputer 10, and a signal "1H" is also inputted in the register data bus 104 from outside the microcomputer 10. In this state, a LOW pulse is inputted as the register-write signal (XEWR) to carry out the above-described setting. As a result, the register at the address 4 provides a programming signal (XPROG) to the EEPROM block 114, and the EEPROM block 114 recognizes that it is the writing mode.

Next, for example, an address of the EEPROM at which data is to be written is designated at the address 1 (RA [0:2]=1H). In this case, in a similar manner as the above-described operation, a signal RA [0:2]=1H is inputted through the register address bus 103 from outside, and an address value of the EEPROM is inputted as RD [0:3] through the register data bus 104. Then, a LOW pulse is inputted as the register write signal (XEWR). An address value is set at the address 2 (RA[0:2]=2H) in a similar manner. As a result, the address register block 302 outputs an address value at which writing to be performed is outputted as the address signal EA [0:7] to the EEPROM block 114 through the EEPROM address bus 115. A data value to be written in the EEPROM 101, as being the is data signal RA[0:2]=3H, is inputted through the register address bus 104 from outside the microcomputer 10, and the data value is inputted to the register data bus 116. Then, when a Low pulse is inputted as the register-write signal (XEWR), the data value to be written is outputted as the data signal ED [0:3] to the EEPROM 101 through the EEPROM data bus 116.

When the designation of the address and the data is completed in this manner, the address signal RA[0:2]=0H is set, and the data signal RD [0:3]=1H is set. In this state, a LOW pulse is inputted as the register-write signal (XEWR). As a result, the data 1H is written in the register at the address 0, and the register at the address 0 outputs the X-decoder enable signal (XDECE) at HIGH level to the EEPROM 101.

Then, in a similar manner, when RD [0:3]=3H is set at the address 0, and then a LOW pulse is inputted as the register-write signal (XEWR), the Y-decoder enable signal (YDECE) is generated. Further, after RD [0:3]=7H is set, and then a LOW pulse is inputted as the register write signal (XEWR), the step-up voltage circuit enable signal (CHGE) is generated. Further, after RD [0:3]=0FH is set, and then a LOW pulse is inputted as the register write signal (XEWR), the sense amplifier enable signal (SENE) is generated. As these steps are completed, all the control signals required for writing the data in the EEPROM 101 are turned to active state, and writing of the data at the designated address of the EEPROM 101 can be started.

When the time required for writing data elapses while the active state is maintained, the data writing is finished. To do this, the EEPROM control signals are successively turned to non-active state in reverse order of the starting of the data writing. Namely, first, data RD [0:3]=7H→3H→1H→0H are written in this order at the address 0, and data 3H is finally written at the address 4, to finish writing data in the EEPROM.

When data in the EEPROM is erased, data 2H is first written at the address 4 to set the data-erasing mode. Then, data in the registers is rewritten in a similar manner as the process of the data writing mode and the EEPROM control signals are manipulated to erase data at a specified address of the EEPROM.

When data is written in a register, the same data is maintained in the register until the data is rewritten Also, the register is formed from flip-flops, so that data is maintained at the timing of the falling-edge of a clock signal. Accordingly, when the EEPROM control signals, such as, the X-decoder enable signal and the Y-decoder enable signal are formed in a manner that they are obtained as address-mapped outputs from the register, the EEPROM control signals can be generated at the timing of input of the register-write signal (XWR) to be provided from outside the microcomputer 10. Also, as to the address and data of the EEPROM, outputs from the register may be inputted to the EEPROM in a similar manner, so that EEPROM data can be written and erased only by controlling writing data to the register. Therefore, the generation timing of the EEPROM control signal and EEPROM address and data can be directly controlled only by the timing of input of the XWR signal inputted from outside the microcomputer 10. As a result, the semiconductor apparatus can readily manipulate EEPROM control signal generation timing without having timing generation circuits, such as, sequencer circuit, oscillation circuit and oscillation signal control circuit. Since sequencer circuits, that have complex structures, do not have to be designed or verified, semiconductor apparatuses having built-in EEPROMs can be developed in a short period of time. Also, the number of address signals and data signals to be outputted outside the microcomputer can be reduced, and control signals can be manipulated without having to take out signals for controlling the EEPROM from the microcomputer 10 on external terminals. As a result, the number of terminals is reduced and thus the wiring region is reduced, resulting in the improved efficiency of integration within semiconductor apparatuses and the reduced chip areas. Manipulation of the microcomputer 10 from outside thereof is simplified, development of tools to be mounted internally or externally for writing or erasing data to the EEPROM within the semiconductor is facilitated, the number of development steps is reduced, and the simplification of development is promoted.

In accordance with the present embodiment, the register address bus and the EEPROM address bus are separated from each other, so that the address space for the register and the address space for the EEPROM are separately provided. As a result, common addresses of the register and the EEPROM are not overlapped with each other. Accordingly, in the case of a microcomputer in which an EEPROM is used as a program storage for the microcomputer, an address region for the register does not have to be prepared in the same address space. As a result, the usable area for the address region can be broadened. This is effective for microcomputers that have particularly small address regions. Also, the address bus for the microcomputer can be commonly used as the EEPROM address bus, and therefore the area of a semiconductor apparatus is effectively minimized. In addition, if the design is made with a smaller number of registers, the bus width of the register address bus can be made narrower, and this further reduces the wiring region.

(Description of Components of Register)

Figure 6:
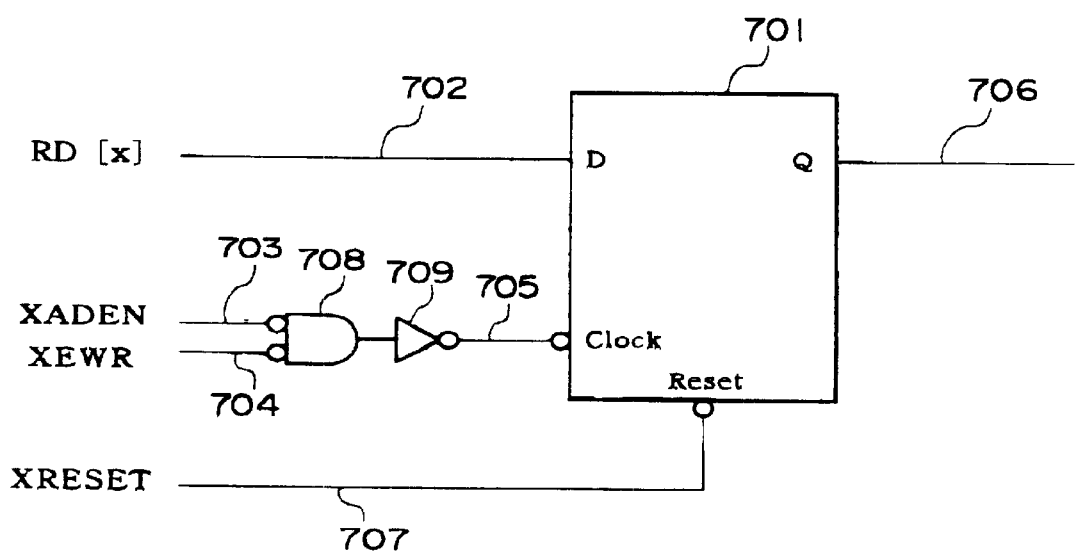
FIG. 6 is a schematical view of composing elements of a register within the register block.

Next, components of a register in accordance with one embodiment are shown in FIG. 6. The register is composed of a flip-flop circuit. A data signal RD [x] (where "x" is ether 0, 1, 2 or 3) on the register data bus RD [0:3] is inputted as a data input signal 702 to the flip-flop circuit 701. A register enable signal 703 (XADEN) generated by the address decoder circuit and a register write signal 704 (XEWR) inputted from outside the microcomputer 10 are inputted in a NAND circuit 708. At the moment when the signals 703 and 704 simultaneously become LOW level, a LOW level signal is inputted as a clock signal 705 through an inverter 709 to the flip-flop circuit 701. At the moment when the LOW pulse enters a clock terminal (C) of the flip-flop circuit 701, the flip-flop circuit 701 stores a data value. The stored data value is outputted as a data output signal 706 from a data output terminal (Q), that functions as an EEPROM control signal, an EEPROM address signal or an EEPROM data signal.

Accordingly, at the timing of input of the register-write signal 704 (XEWR) from outside the microcomputer 10 to the register block 102, signals for writing in the EEPROM 101 are directly controlled. As a result, data writing and erasing with the EEPROM are performed with a relatively simple structure, without mounting a sequencer circuit that requires being precise and complex in consideration of the timing to obtain signals that are inputted in the EEPROM. These features realize microcomputers that are effective in debugging during development and simpler external control.

(Description of Control Signal Generation Register)

Figure 7:
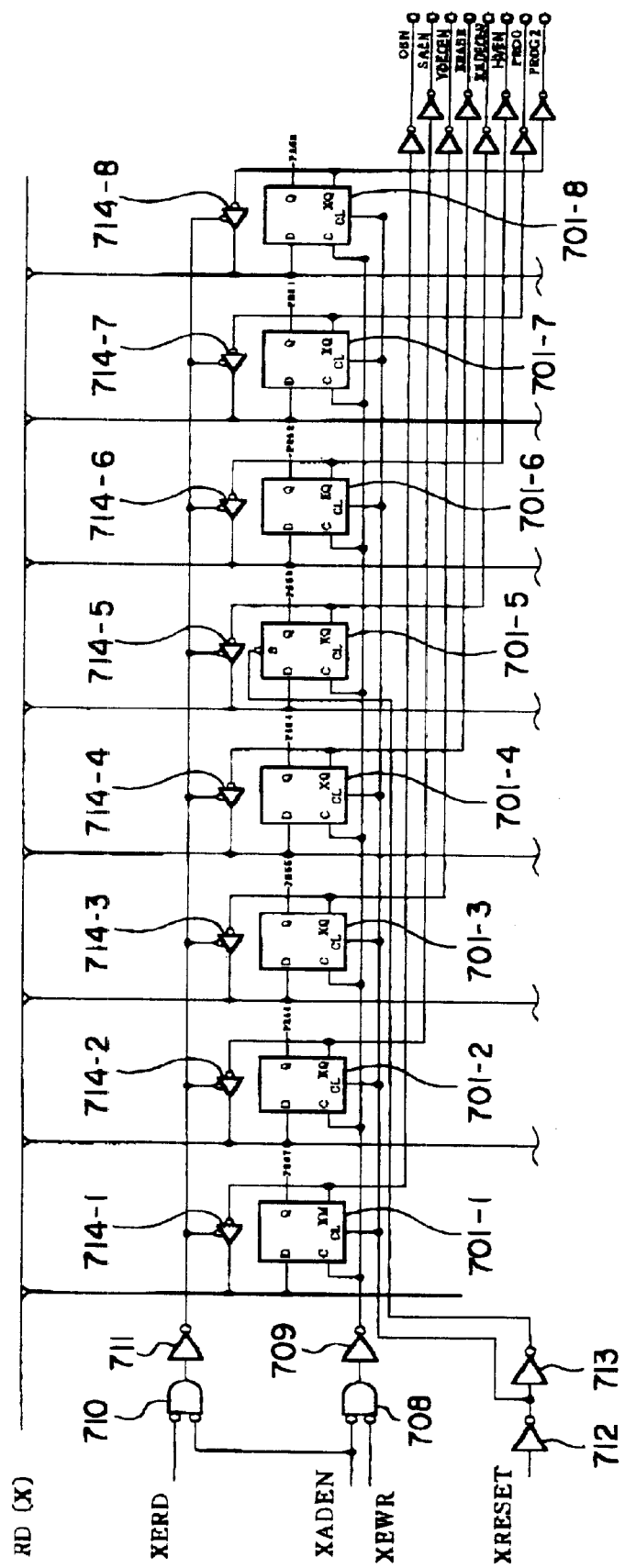
FIG. 7 is a schematical view of a register for generating control signals within the register block.

FIG. 7 shows an embodiment structure of a register that generates control signals for the EEPROM 101. FIG. 7 shows, for example, eight flip-flops 701-1 to 701-8, each of which is the same flip-flop as the flip-flop 701 shown in FIG. 6. Data RD [X] of eight bits are inputted in parallel to respective data input terminals (D), and the data RD [X] are simultaneously outputted from inversion output terminals (XQ) at the same timing shown in FIG. 6, and supplied to the EEPROM block 114 through inverters.

When reading operation is performed, control signals are read out simultaneously from the inversion output terminals (XQ) of the flip-flops 701-1 to 701-8 through clocked inverters 714-1 to 714-8. For this purpose, there are provided a NAND circuit 710 and an inverter 711 that are inputted with a register read signal (XERD) and a register enable signal (XADEN). An output of the inverter 711 is inputted to clock terminals of the clocked inverters 714-1 to 714-8.

To simultaneously initialize the flip-flops 701-1 to 701-8, a register-reset signal (XRESET) being active at LOW level is supplied to the flip-flops 701-1 to 701-8. A register reset signal (XRESET) is inputted through an inverter 712 to reset terminals (CL) of the flip-flops 701-1 to 701-4 and 701-6 to 701-8, except the flip-flop 701-5, to thereby perform initialization (XQ terminals have HIGH level.) On the other hand, a register reset signal (XRESET) is inputted through the two inverters 712 and 713 to a set terminal (S) of the flip-flop 701-5, to thereby perform initialization (XQ terminal has LOW level.)

It is noted that only the control signal XXZDECEN for the output of the flip-flop 701-5 is LOW active, and all the other control signals for the outputs from the other flip-flops 701-1 to 701-4 and 701-6 to 701-8 are HIGH active. Therefore, even when the outputs of the flip-flops 701-1 to 701-8 are all at HIGH or LOW level at the time of power-on, data of the EEPROM 101 is not destroyed.

(Description or Register for Rewriting Data)

Figure 8:
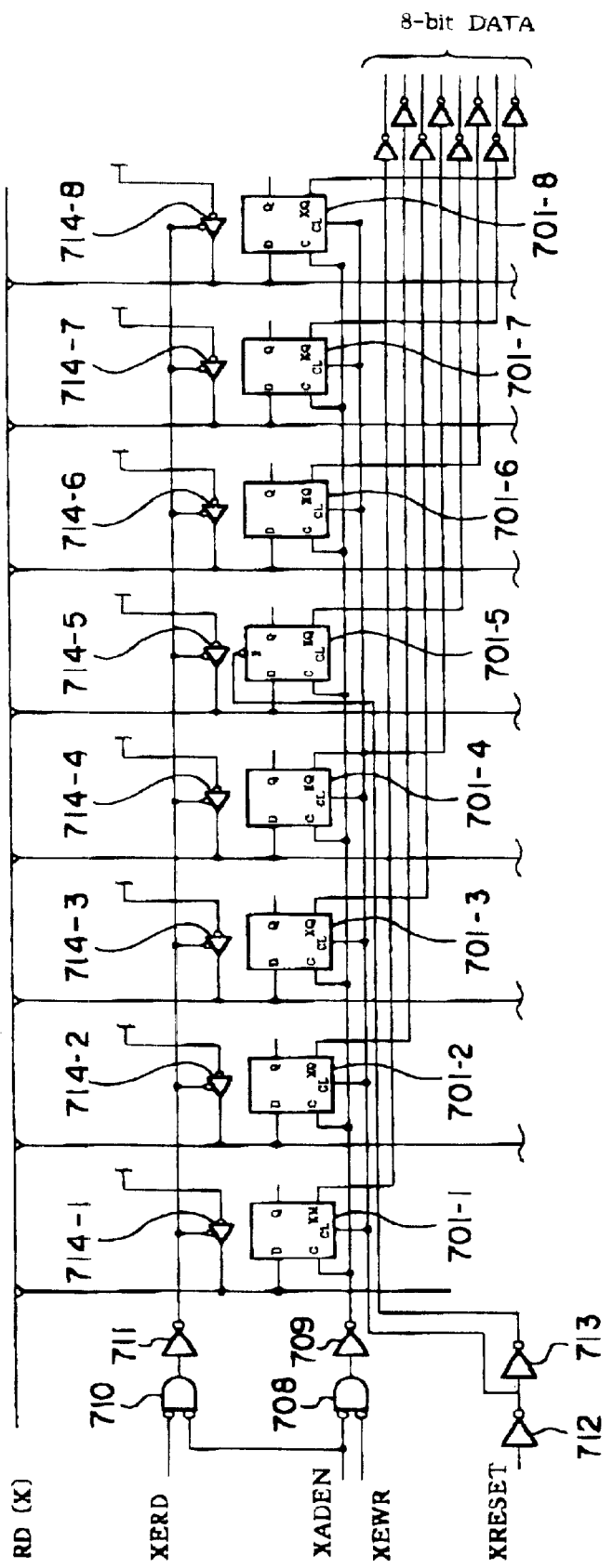
FIG. 8 is a schematical view of a register for rewriting data within the register block.

FIG. 8 shows an example of a register for rewriting data. The register transfers data of eight bits, and has a structure similar to that of the register shown in FIG. 7. FIG. 8 differs from FIG. 7 in that input terminals of clocked inverters 714-1 to 714-8 to be used for reading data are connected to output lines of the EEPROM block 114 through tri-state switches (not shown). Therefore, in the operation of reading rewriting data, data stored in the EEPROM 101 is read through the clocked inverters 714-1 to 714-8 at the same timing as described with reference to FIG. 7.

What is claimed is:

1. A microcomputer comprising:
   a nonvolatile memory in which a programming mode and a normal reading mode are set;
   a register which is connected to the nonvolatile memory through a switch in the programming mode;
   a register data bus and a register address bus connected to the register;
   a memory data bus and a memory address bus connected between the nonvolatile memory and the register, and
   a central processing unit that accesses the nonvolatile memory through a cpu bus and the switch in the normal reading mode,
   wherein the switch connects the nonvolatile memory to the cpu bus in the normal reading mode and connects the nonvolatile memory to the register in the programming mode,
   wherein the register comprises a memory control signal register block, a memory address register block, a memory data register block and a register address decoder,
   wherein, when the programming mode is set at least one register control signal, at least one register address and register data are supplied to the register, the register data is stored to any one of the register blocks in accordance with an enable signal from the register address decoder which decodes the register address, and
   wherein each of the register data is read out from the register and supplied to the nonvolatile memory as a memory control signal, a memory address and a memory data without an operation of the central processing unit.

2. The microcomputer according to claim 1, wherein the register has an address value.

3. The microcomputer according to claim 2, wherein the address value of the register exists in an address space different from an address space that is allocated to the nonvolatile memory.

4. The nonvolatile memory apparatus according to claim 3, further comprising an input/out apparatus, wherein a signal supplied to the register is input through the input/output apparatus from an outside device.

5. The microcomputer according to claim 4, wherein the address value of the register is designated by the signal input through the input/output apparatus from an outside device.

6. The microcomputer according to claim 4, wherein a data value to be stored in the register is designated by the signal input through the input/output apparatus from an outside device.

7. The microcomputer according to claim 4, wherein a data value stored in the register is initialized by a signal input through the input/output apparatus from an outside device.

8. The microcomputer according to claim 7,
   wherein the input/output apparatus includes a parallel input/output apparatus to which a plurality of data are inputted in parallel, and
   wherein the plurality of data inputted through the parallel input/output apparatus are supplied to the register.

9. The microcomputer according to claim 8, further comprising:
   a first switch that selectively connects the parallel input/output apparatus to one of the cpu bus or the register,
   wherein the first switch connects the parallel input/output apparatus to the register in the programming mode, and connects the parallel input/output apparatus to the data bus in the normal reading mode.

10. The microcomputer according to claim 7,
    wherein the input/output apparatus includes a serial input/output apparatus to which a plurality of data are inputted in serial, and
    wherein the central processing unit supplies the plurality of data inputted in serial through the serial input/output apparatus to the register in parallel.

11. The microcomputer according to claim 7,
    wherein the programming mode includes a serial input mode and a parallel input mode; and the input/output apparatus includes a serial input/output apparatus to which a plurality of data are inputted in serial in the serial input mode, and a parallel input/output apparatus to which the plurality of data are inputted in parallel in the parallel input mode, and wherein the central processing unit supplies the plurality of data inputted in serial through the serial input/output apparatus to the register in the serial input mode, and the plurality of data inputted through the parallel input/output apparatus are supplied to the register in the parallel input mode.

12. The microcomputer according to claim 11, further comprising:

a first switch that selectively connects the parallel input/output apparatus to one of the cpu bus and the register;

wherein the first switch connects the parallel input/output apparatus to the register in the programming mode, and connects the parallel input/output apparatus to the data bus in the normal reading mode.

13. A nonvolatile memory apparatus comprising:

a nonvolatile memory in which a programming mode and a normal reading mode are set;

a register which is connected to the nonvolatile memory through a switch in the programming mode;

a register data bus and a register address bus connected to the register;

a memory data bus and a memory address bus connected between the nonvolatile memory and the register, wherein the switch connects the nonvolatile memory to a cpu bus in the normal reading mode and connects the nonvolatile memory to the register in the programming mode, wherein the register comprises a memory control signal register block, a memory address register block, a memory data register block and a register address decoder, wherein when the programming mode is set, at least one register control signal, register address and register data are supplied to the register, at least one register data is stored to any one of the register blocks in accordance with an enable signal from the register address decoder which decodes the register address, and each of data is read out from the register to the nonvolatile memory, and wherein each of the register data is read out from the register and supplied to the nonvolatile memory as a memory control signal, a memory address and a memory data without an operation of a central processing unit.

14. The nonvolatile memory apparatus according to claim 13, wherein the programming mode includes a data rewrite operation, and wherein address data, rewrite data and control data required for the data rewrite are supplied to the register, and each of the data is read out from the register, to thereby perform a rewrite of data in the nonvolatile memory.

15. The nonvolatile memory apparatus according to claim 13, wherein the programming mode includes a reading operation of rewrite data, wherein address data and control data required for the reading operation of the rewrite data are supplied to the register, and each of the data is read out from the register, thereby the rewrite data is read out from the nonvolatile memory, and wherein the rewrite data read out from the nonvolatile memory is output through the register.

16. The nonvolatile memory apparatus according to claim 13, wherein the programming mode includes a data erasing operation, and wherein address data and control data required for the data erasing operation are supplied to the register, and each of the data is read out from the register to erase the data in the nonvolatile memory.

17. The nonvolatile memory apparatus according to claim 13, wherein the register includes flip-flops, and the control data is supplied to and read from flip-flops, so that control timing signals required for execution of the programming mode are supplied to the nonvolatile memory, wherein at least one of the control timing signals has a logic state different from those timing signals in the active state.

18. The nonvolatile memory apparatus according to claim 17, wherein at least one of the control timing signals has a logic state different from those timing signals in an active state.

19. The nonvolatile memory apparatus according to claim 13, further comprising an input/output apparatus, wherein the data to be supplied to the register is input through the input/output apparatus from an outside device.

20. A microcomputer comprising:

a nonvolatile memory in which a programming mode and a normal reading mode are set;

a register connected to the nonvolatile memory;

a register data bus and a register address bus connected to the register;

a memory data bus and a memory address bus connected between the nonvolatile memory and the register; and a central processing unit that accesses the nonvolatile memory in the normal reading mode, wherein the register comprises a memory control register block, a memory address register block, a memory data register block and a register address decoder, wherein a plurality of data necessary for executing the programming mode includes at least one register control signal, at least one register address and at least one register data that are supplied to the register, at least one register data being stored to any one of the register blocks in accordance with an enable signal from the register address; and wherein when the programming mode is set, the plurality of data necessary for execution of the programming mode is read out from the register to the nonvolatile memory without using a sequencer circuit to provide timing signals for the plurality of data.

21. A nonvolatile memory apparatus comprising:

a nonvolatile memory in which a programming mode and a normal reading mode are set;

a register connected to the nonvolatile memory;

a register data bus and a register address bus connected to the register;

a memory data bus and a memory address bus connected between the nonvolatile memory and the register, wherein the register comprises a memory control signal register block, a memory address register block, a memory data register block and a register address decoder, wherein a plurality of data necessary for executing the programming mode includes at least one register control signal, at least one register address and at least one register data that are supplied to the register, the at least one register data being stored to any one of the register blocks in accordance with an enable signal from the register address decoder which decodes the register address; and wherein when the programming mode is set, the plurality of data necessary for execution of the programming mode is read out from the register to the nonvolatile memory without using a sequencer circuit to provide timing signals for the plurality of data.

* * * * *